US008502551B2

(12) United States Patent
Yunoki (10) Patent No.: US 8,502,551 B2
(45) Date of Patent: Aug. 6, 2013

(54) ELECTRONIC COMPONENT AND INSPECTION SYSTEM

(75) Inventor: Hirotomo Yunoki, Chiba (JP)

(73) Assignees: Sony Corporation, Tokyo (JP); Sony Computer Entertainment Inc., Tokyo (JP)

( * ) Notice: Subject to any disclaimer, the term of this patent is extended or adjusted under 35 U.S.C. 154(b) by 475 days.

(21) Appl. No.: 12/909,976

(22) Filed: Oct. 22, 2010

(65) Prior Publication Data

US 2011/0095776 A1    Apr. 28, 2011

(30) Foreign Application Priority Data

Oct. 27, 2009  (JP) .................................. 2009-246200
Sep. 29, 2010  (JP) .................................. 2010-218679

(51) Int. Cl.
*G01R 31/00* (2006.01)
(52) U.S. Cl.
USPC ..................................................... 324/756.01

(58) Field of Classification Search
None
See application file for complete search history.

(56) References Cited

FOREIGN PATENT DOCUMENTS

JP            8-285530         11/1996

OTHER PUBLICATIONS

Translatation of JP08-285530.*

* cited by examiner

*Primary Examiner* — Jermele M Hollington
(74) *Attorney, Agent, or Firm* — Katten Muchin Rosenman LLP (57) ABSTRACT

A CPU 14 built in to a device 1 starts inspection processing in response to an I/F 17 having received an inspection start command from an external terminal 3, switches an inspection terminal 13, which is a redundant terminal 11, over to be an input terminal with a pull-up resistor, applies a predetermined voltage to the inspection terminal 13, detects the input voltage of the inspection terminal 13, and transmits the detected input voltage as an inspection result to the external terminal 3.

8 Claims, 7 Drawing Sheets

ELECTRONIC COMPONENT AND INSPECTION SYSTEM

BACKGROUND OF THE INVENTION

1. Field of the Invention

The present invention relates to an electronic component, which has multiple terminals connected on a mounting surface of a substrate through soldering, and an inspection system for the same.

2. Description of the Related Art

An inspection apparatus, which takes images of soldering junctions of the substrate terminals and a device using a video camera to judge whether or not they are properly soldered based on the taken images is well known (e.g., refer to Japanese Unexamined Patent Application Publication No. Hei 8-285530).

SUMMARY OF THE INVENTION

However, this inspection apparatus, when it is difficult to externally confirm cracking or rupture of the soldering junctions regardless of unstable electric contact, may not be able to detect a poor connection. Moreover, since a special inspection apparatus is required, when a failure occurs after the substrate is integrated into a product and shipped, and inspection and repair of the mounted state of the device on the substrate is necessary, that product (device and substrate) must be sent to the factory etc. at which the inspection process is carried out and then inspected, which is troublesome.

Therefore, the present invention aims to provide an electronic component that may be inspected promptly and easily whether or not it is properly mounted on the substrate without needing a special inspection apparatus, and an inspection, system for the same.

The electronic component of the present invention includes a plurality of terminals to be connected to a mounting surface of the substrate through soldering. The electronic component further includes a transmitting and receiving unit and a detection controller. Transmitting and receiving unit transmits and receives information to and from an external terminal. The detection controller starts inspection processing in response to the transmitting and receiving unit having received the inspection start information from the external terminal in a state where the plurality of terminals is connected to the mounting surface, and then makes the transmitting and receiving unit transmit inspection results to the external terminal.

The plurality of terminals includes functional terminals to be connected to another device, and redundant terminals not connected to the other device. The redundant terminals include inspection terminals that are each switchable to be an input terminal either with a pull-up resistor or a pull-down resistor.

The detection controller, in the inspection processing, switches the respective inspection terminals over to be an input terminal either with a pull-up resistor or a pull-down resistor so that a predetermined voltage can be applied to the respective inspection terminals, detects input voltages of the inspection terminals, and transmits detected input voltages as inspection results to the external terminal.

According to the present invention, mounting state on a substrate of an electronic component may be inspected promptly and easily without needing a special inspection apparatus.

Artisan will fully understand the above and further objects and features of the present invention by reading preferred embodiments of the invention described herein in connection with the accompanying drawings, including features recited in the appended claims, as well as explicit and implicit effects and advantages of the invention, including those to be apparent through implementation of the invention.

DETAILED DESCRIPTION OF THE PREFERRED EMBODIMENTS

A preferred embodiment of the present invention is described below with reference to the accompanying drawings. It is noted that like parts or elements are designated by like reference characters in the drawings, without redundant description of the parts or elements.

A first embodiment of the present invention is described hereafter based on the accompanying drawings.

Figure 1:
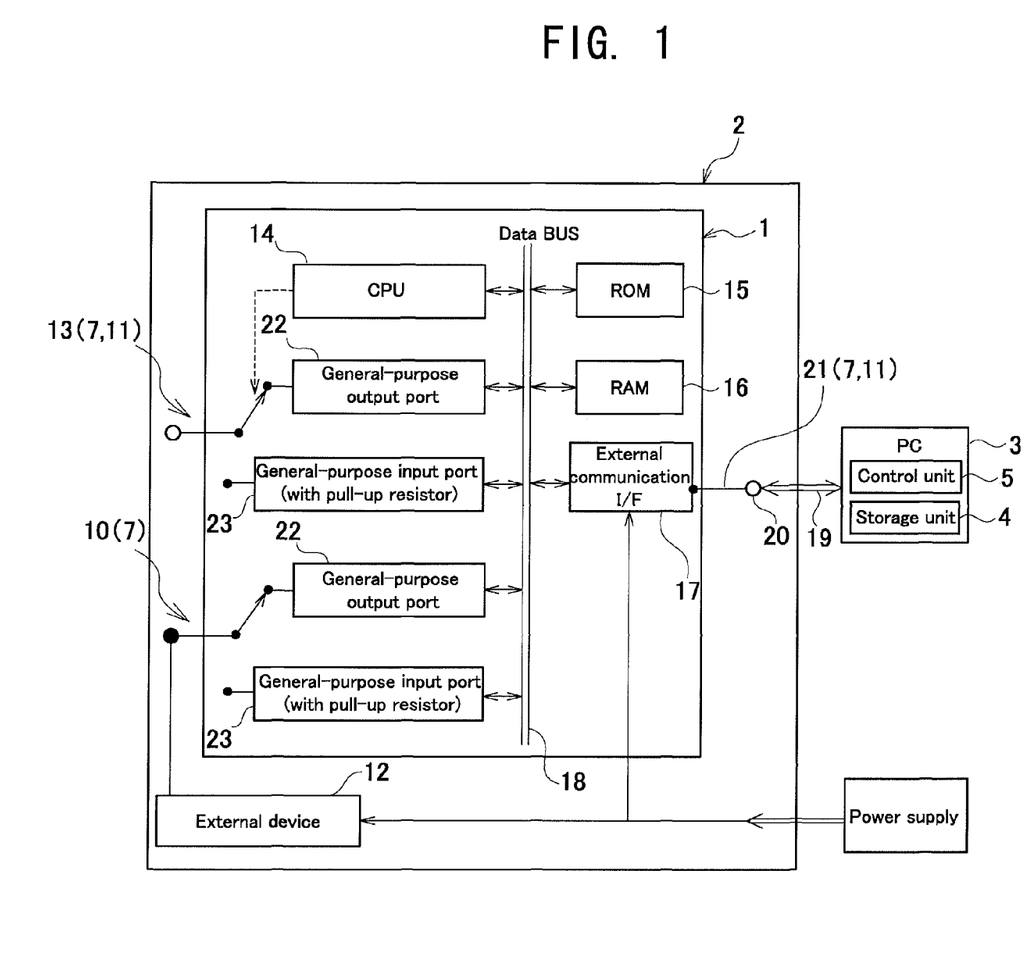
FIG. 1 is a functional block diagram showing an embodiment of the present invention.
Figure 2:
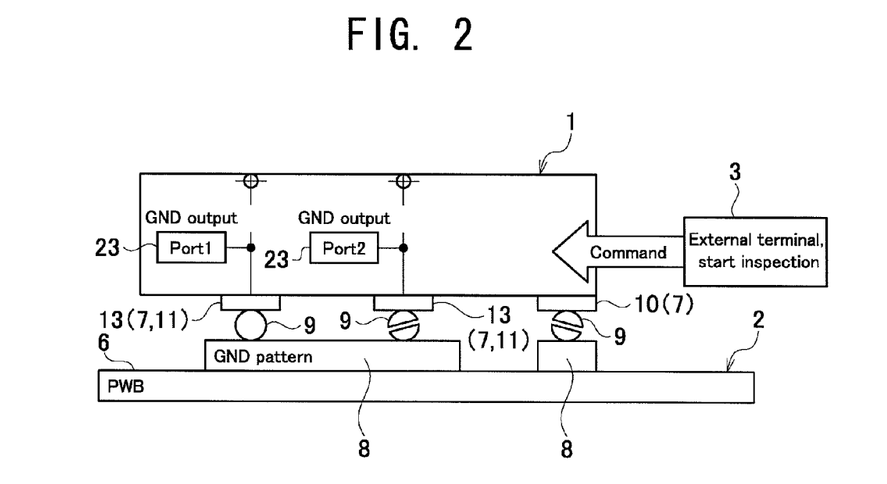
FIG. 2 is a schematic diagram showing nominal mode.

As shown in FIGS. 1 and 2, an inspection system according to this embodiment is for determining whether or not electrical connection through soldering between a surface mount device (electronic component) 1 and a substrate (printed wiring board) 2 is proper, and includes a general-purpose external terminal (e.g., PC: personal computer) 3.

A storage unit 4 of the external terminal 3 is stored with an inspection program. The inspection program includes an expected value pattern described later, and a control unit 5 of the external terminal 3 conducts inspection processing in conformity with the inspection program.

Circuit patterns (omitted from the drawings) extending from connecting electrodes 8 corresponding to terminals 7 of the device 1 are formed on a mounting surface 6 of the substrate 2. The circuit patterns include a circuit pattern (power supply pattern) connecting to a power supply of the device 1 and a circuit pattern (GND pattern) set to a GND level. One of redundant terminals 11 described later is allotted as a power supply terminal.

The device 1 is a semiconductor chip structured as a one-chip microcomputer, such as a large scale integrated circuit (LSI) or an ultra large scale integrated circuit (ULSI), for example.

The multiple terminals 7 are fanned on the back of the device 1 facing the mounting surface 6 of the substrate 2. The respective terminals 7 are mounted on the substrate 2 by being soldered to the connecting electrodes 8 of the substrate 2, respectively, and are electrically connected to the circuit pattern via the connecting electrodes 8. A solder ball is provided to each of the terminals 7, and in a mounting process on the device 1, heating the entire mounting surface 6 in a state where the respective solder balls are touching the respective connecting electrodes 8 fuses the solder balls into solder joints 9, and consequently the terminals 7 are connected to the respective connecting electrodes 8 by the solder joints 9.

The multiple terminals 7 include multiple functional terminals 10 and multiple redundant terminals 11. The functional terminals 10 are terminals to be connected to another external device 12 via the connecting electrodes 8 and circuit patterns. The redundant terminals 11 are free terminals not connected to the external device 12. One of the redundant terminals 11 is allotted as a power supply terminal. A connecting electrode 8 to be connected to the power supply terminal is connected to the power supply pattern. Moreover, at least one of the redundant terminals 11 other than the power supply terminal is used as an inspection terminal 13. The inspection terminal 13 is switchable to be an input terminal with a pull-up resistor. Note that all of the redundant terminals 11 may be terminals, each being switchable to be an input terminal with a pull-up resistor. Moreover, the connecting electrodes 8, which are connected to the redundant terminals 11 except for the power supply terminals and a communication terminal 21 described later, are connected to the GND pattern.

The device 1 includes a central processing unit (CPU) 14, read only memory (ROM) 15, random access memory (RAM) 16, interface (I/F) for external communication 17, and a data bus 18. The CPU 14 functions as a detection controller (detection control unit), and the I/F 17 functions as a transmitting and receiving unit (i.e., transmitter/receiver). A removable port 20, which is connected to a communication line 19, is provided on the substrate 2. The port 20 is connected to the external terminal 3 via the communication line 19, and the I/F 17 of the device 1 transmits and receives data to and from the external terminal 3 via the circuit pattern, the port 20, and the communication line 19. One of the redundant terminals 11 other than the power source terminal and the inspection terminal 13 is allocated as the aforementioned communication terminal 21 used for transmission with the external terminal 3.

The ROM 15 is stored with firmware, and the CPU 14 conducts predetermined processing in conformity with the firmware. The firmware includes a voltage detection program. Once the device 1 receives an inspection start command (inspection start information) from the external terminal 3, it changes to be in inspection mode from normal mode.

When it is changed to the inspection mode, the CPU 14 conducts inspection processing in conformity with the voltage detection program. The inspection terminal 13 in normal mode is setup on the general-purpose output port 22 side by the CPU 14, and output thereof is kept in grand level (GND level). Moreover, once changed from normal mode to inspection mode, the CPU 14 quickly switches the inspection terminal 13 over to connect to a general-purpose input port 23 with a pull-up resistor. According to this switch-over, a predetermined voltage (power supply voltage in this embodiment) is applied to the, inspection terminal 13, that input voltage is detected, and the detected value is then stored as level data in the RAM 16. Once detection of input voltage and storage of level data for all of the inspection terminals 13 is completed, the CPU 14 transmits the level data stored in the RAM 16 to the external terminal 3. Note that a circuit for converting the power supply voltage may be provided so as to apply a predetermined voltage other than the power supply voltage to the inspection terminals 13 in the inspection mode.

The external terminal 3, which has received the level data from the device 1, compares the detected data pattern of the received level data to a predetermined expected value pattern, judges whether there is a mounting abnormality, and displays judgment results on a monitor screen (omitted from the drawing).

Next, relationship between input voltage and connection state of the inspection terminal 13 in inspection mode is described.

As shown in FIG. 2, in normal mode (initial state), output of the inspection terminals 13 is in GND level, and the connecting electrode 8 of the substrate 2 to which the inspection terminals 13 are to be connected is also in GND level.

Figure 3:
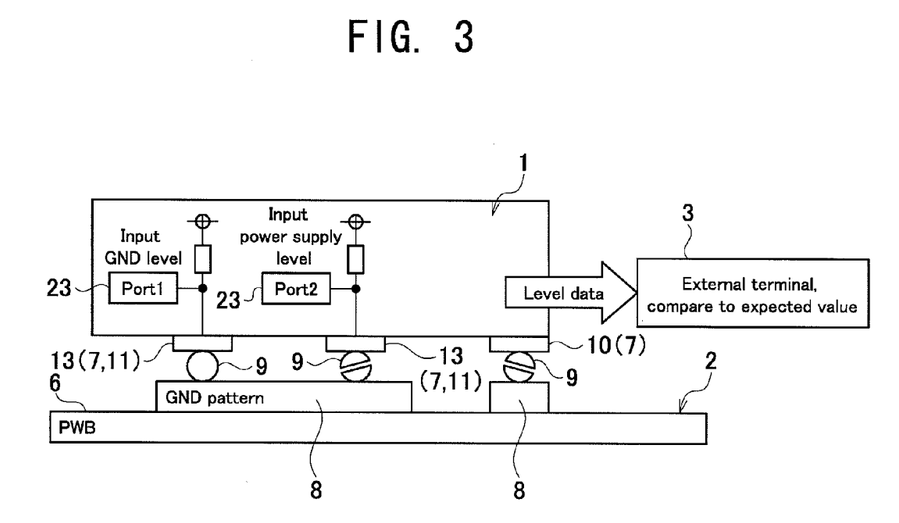
FIG. 3 is a schematic diagram showing inspection mode.

As shown in FIG. 3, changing from normal mode to inspection mode, the inspection terminals 13 are each switched over to be an input terminal with a pull-up resistor, and when a power source voltage is applied, input voltages (input voltages at Ports 1 in FIG. 3) of the inspection terminals 13 are kept in GND level as long as the inspection terminals 13 are properly connected to the respective connecting electrodes 8 via the solder joints 9.

Meanwhile, if there is an abnormality such as a crack in the solder joint 9, and electrical connection between an inspection terminal 13 and the connection terminal is severed, the input voltage (input voltage at Port 2 in FIG. 3) of the inspection terminal 13 is pulled up to the power source level by the pull-up resistor.

In other words, when the input voltage at the time of when the inspection terminal 13 is switched over to be an input terminal with a pull-up resistor and the power supply voltage is applied thereto is in GND level, it may be judged as a proper connection, and when the input voltage is in power supply level, it may be judged as a faulty connection.

Next, relationship between faulty connection of the inspection terminal 13 and connection state of the functional terminal 10 is described.

A principal reason why a faulty connection occurs between the terminal 7 and the connecting electrode 8 is that temperature distribution when heating the mounting surface 6 in the mounting process on the device 1 is not uniform. If a region of a higher or lower temperature than the appropriate temperature generates at the time of heating, excessive or insufficient heating of solder balls results, the solder joints 9 are not formed properly, and faulty connection may occur.

Moreover, another reason is deformation of the substrate 2 and the device 1. If the substrate 2 and the device 1 are deformed, fluctuation in relative positional relationships between the terminals 7 and the connecting electrodes 8 occurs in the mounting process on the device 1, and faulty connections therebetween without making proper contact may occur.

Faulty connections due to such reasons are caused at any rate by the position of the terminals 7, and when a certain one of the terminals 7 has a faulty connection, there is a high possibility that another one of the terminals 7 arranged within a predetermined range from that certain terminal 7 also has a faulty connection. The present invention has been focused on in such actual situations, wherein a functional terminal 10 within a predetermined judgment distance from an inspection terminal 13 (redundant terminal 11) detected to have a faulty connection is presumed to have a faulty connection, and the connection state of the functional terminal 10 is judged whether it is appropriate or not.

Figure 4:
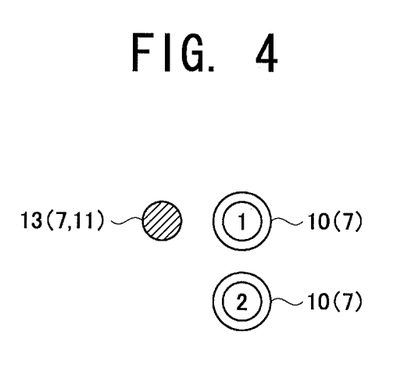
FIG. 4 is a schematic diagram showing judgment distance.

The judgment distance is preset based on results of testing and the like. In the example of FIG. 4, a quadrille (grid-like) array pattern of terminals is assumed, wherein judgment distance where connection state of a terminal 7 (functional terminal 10 given the symbol 1 in FIG. 4) adjacent to a reference terminal 7 (inspection terminal 11) either in the lengthwise direction or the widthwise direction (widthwise direction is exemplified in FIG. 4) is subject to judgment is defined as '1'. Meanwhile, judgment distance where connection state of a terminal 7 adjacent to the reference terminal 7 (inspection terminal 11) in the lengthwise direction and a terminal 7 adjacent in the widthwise direction to that terminal 7, as well as connection state of a terminal 7 adjacent to the reference terminal 7 in the widthwise direction (functional terminal 10 given the symbol 1 in FIG. 4) and a terminal 7 adjacent in the lengthwise direction to that terminal 7 are subject to judgment is defined as '2'. The larger the judgment distance is set, the harsher the inspection criteria become, and when the judgment distance is set to infinity, the device 1 is judged to have a faulty connection as long as all of the inspection terminals 13 are not detected to be in a proper connection state.

The expected value pattern and detected data pattern are described next.

Figure 5:
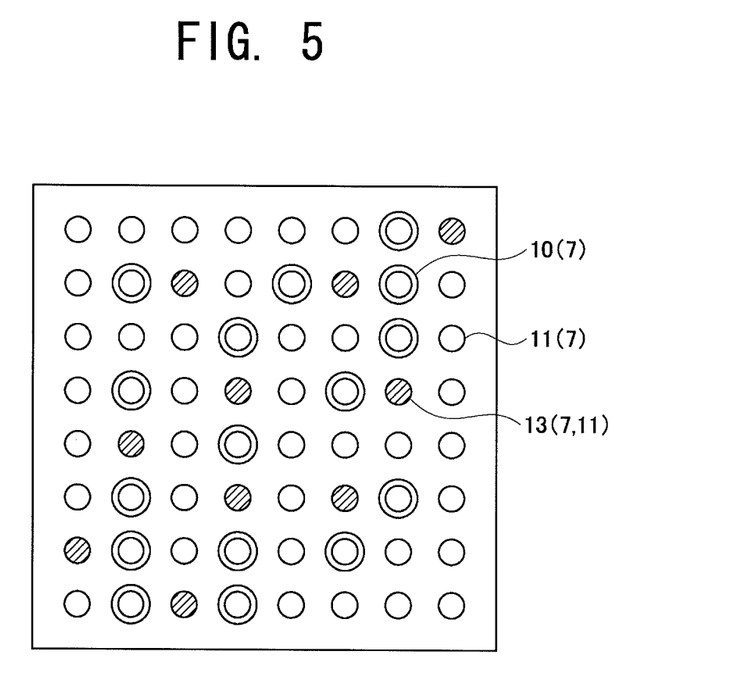
FIG. 5 is a schematic diagram showing an expected value pattern.
Figure 6:
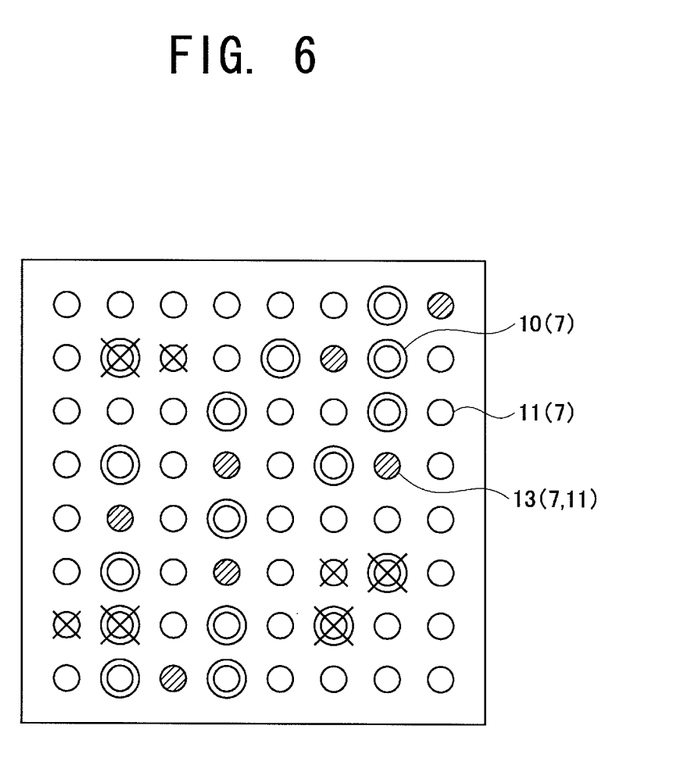
FIG. 6 is a schematic diagram showing a detected data pattern.

FIGS. 5 and 6 illustrate cases where sixty four terminals 7 are arranged in a quadrille array. Fifteen of the sixty four terminals 7 are the function terminals 10. (indicated by double circles in FIGS. 5 and 6), and the rest are the redundant terminals 11. Ten of the redundant terminals 11 ate setup as the inspection terminals 13 (indicated by diagonal lines in FIG. 5). Moreover, this example has the judgment distance set to '1', and the inspection terminals 13 are setup from the redundant terminals 11 such that there is at least one of the inspection terminals 13 adjacent to each of the functional terminals 10 in the lengthwise direction or the widthwise direction. In the expected value pattern (FIG. 5), all of the level data of the inspection terminals 13 is set to GND level.

Contrary to the expected value pattern shown in FIG. 5, when a detected data pattern is as shown in FIG. 6, connection state of the functional terminals 10 is judged in the following manner.

The detected data pattern shown in FIG. 6 includes level data of three out of the ten inspection terminals 13, which are all in power supply level, wherein these terminals are detected to have faulty connections through comparison with the expected value pattern. In FIG. 6, these inspection terminals 13 detected to have faulty connections are represented by x marks. In judgment of connection states of the functional terminals 10, with the respective inspection terminals 13 detected as having faulty connection as a reference, connection states of all of the functional terminals 10 having the judgment distance '1' from respective inspection terminals 13 (four of the functional terminals 10 in this example) are judged as improper (faulty connections). In FIG. 6, these functional terminals 10 judged to have faulty connections are represented by x marks.

Moreover, the number of inspection terminals 13 may be increased or decreased in accordance with the width of the judgment distance (setup more terminals when the judgment distance is narrow, and fewer when it is wider), and in the example of FIG. 6, the number of the inspection terminals 13 may be reduced by setting the judgment distance long (e.g., set the judgment distance to '2').

Figure 7:
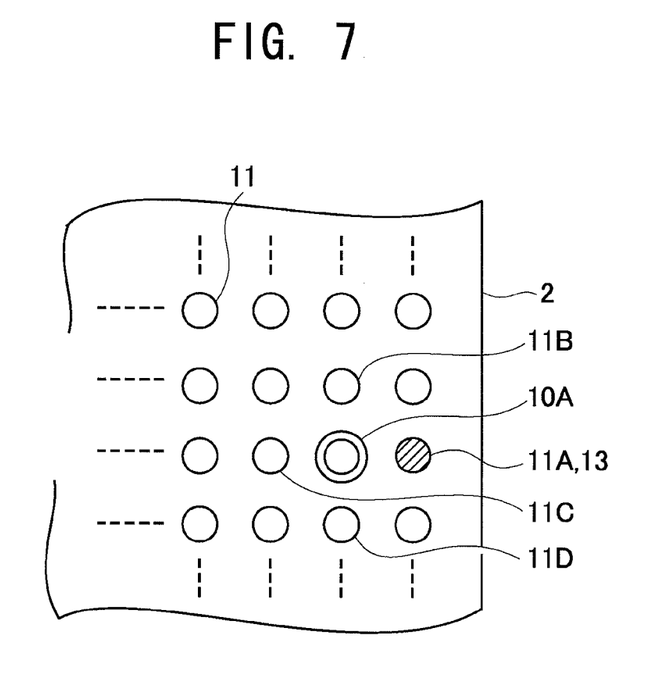
FIG. 7 is a schematic diagram explaining selection criteria for an inspection terminal.
Figure 8:
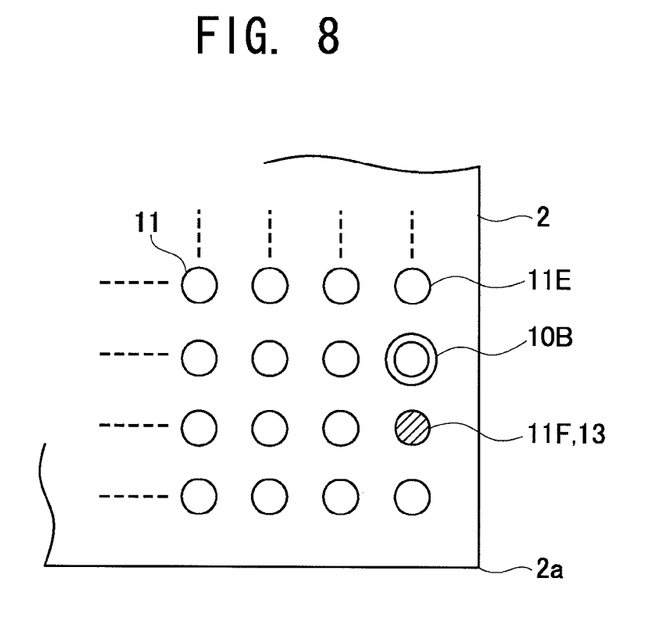
FIG. 8 is a schematic diagram explaining selection criteria for an inspection terminal.

Furthermore, influence of deformation (curvature) of the substrate 2 on the connection state of the terminal 7 makes the peripheral edge side of the substrate 2 larger than the central portion thereof, and therefore in the case where multiple redundant terminals 11 exist within the judgment distance of one of the functional terminals 10 it is preferable to select of the multiple redundant terminals 11, those that are arranged on the outermost side of an array pattern of the terminals 7 as the inspection terminals 13. For example, assume the case of an array pattern of the terminals 7 as shown in FIG. 7, where the judgment distance is '1'. In the case of four redundant terminals 11A to 11D with judgment distance '1' from a functional terminal 10A, of the four redundant terminals 11A to 11D, the redundant terminal 11A arranged in the periphery of the functional terminal 10A should be used as an inspection terminal 13. Moreover, in the case where a functional terminal 10B is arranged in the outermost periphery of an array pattern as shown in FIG. 8, and redundant terminals 11E and 11F exist adjacent to the functional terminal 10B in the outermost periphery, the redundant terminal 11E or 11F (one of them if there are many) in the outermost periphery should be used as an inspection terminal 13. Alternatively, in the case where the redundant terminals 11E and 11F exist on either side of the functional terminal 10B, and of them, the redundant terminal 11F is closer to a corner 2a of the substrate 2, it is preferable to use the redundant terminal 11F close to the corner 2a as the inspection terminal 13.

Figure 9:
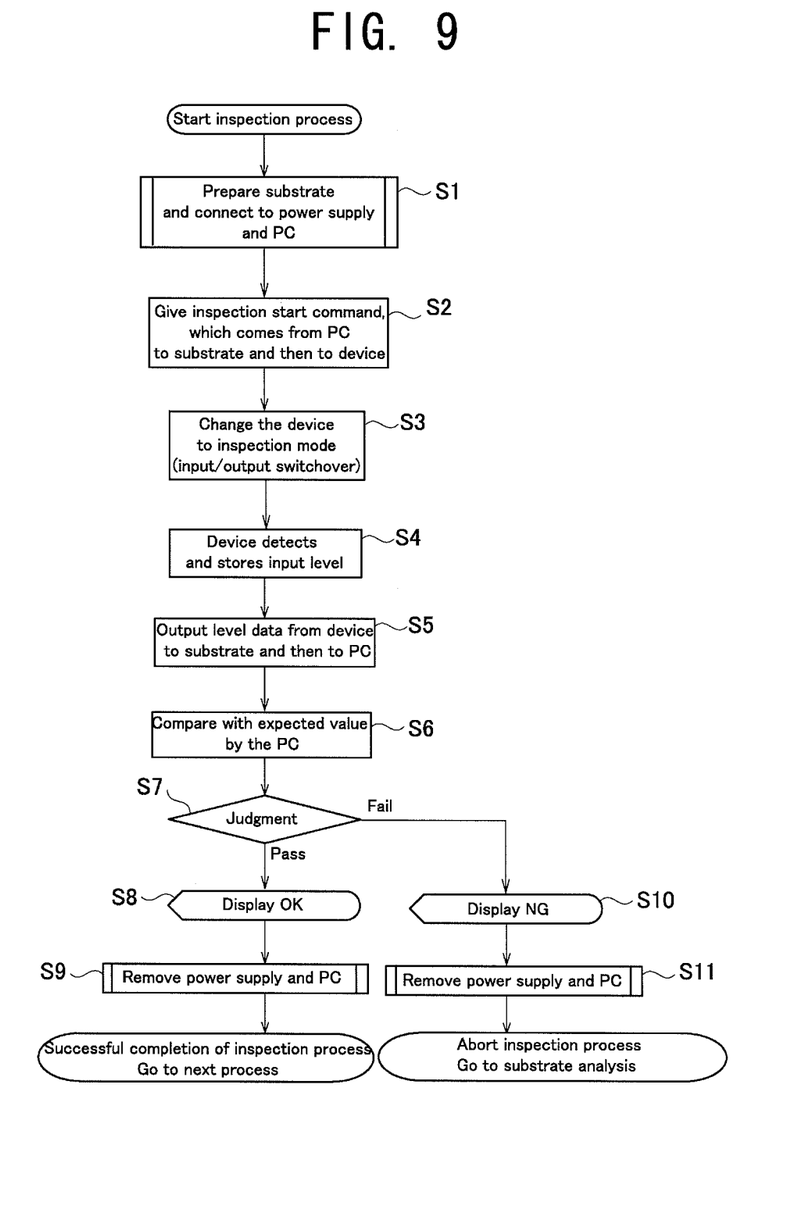
FIG. 9 is a flowchart showing an inspection process.

Next, an inspection process according to this embodiment is described, while referencing the flowchart of FIG. 9.

An inspection operator connects the external terminal 3 and the port 20 of the substrate 2 mounted on the device 1 using the communication line 19, and turns on the device 1 (Step S1). Next, a predetermined input for commanding to start the inspection process is entered using an input unit (omitted from the drawing) such as a keyboard of the external terminal 3. If the inspection operator enters a start command, the external terminal 3 starts processing in conformity with the inspection program, and displays on a monitor screen an image requesting a command for starting execution of the inspection processing.

The inspection operator inputs to the input unit a command to start execution in accordance with the request displayed on the monitor screen, The external terminal 3 transmits an instruction start command to the device 1 in conformity to this input (Step S2). The device 1 having received the inspection start command changes to be in inspection mode from normal mode, and the CPU 14 starts the inspection processing. In this inspection processing, the CPU 14 switches an inspection terminal 13 over to the general-purpose input port 2.3 side with a pull-up resistor (Step S3), applies the power supply voltage to the inspection terminal 13, detects that input voltage, and stores the detected value as level data in the RAM 16 (Step S4). Once detection of input voltage and storage of level data for all of the inspection terminals 13 is completed, the CPU 14 transmits the level data stored in the RAM 16 to the external terminal 3 (Step S5). Inspection processing on the device 1 side is completed by transmission of the level data, and the device 1 changes to be in normal mode from inspection mode.

The external terminal 3 receives the level data from the device 1, compares the detected data pattern of the received level data to the preset expected value pattern, and detects a faulty connection of the inspection terminal 13. It then judges that the functional terminal 10 positioned at a predetermined judgment distance has a faulty connection using the inspection terminal 13 detected to have a faulty connection as a. reference (Step S7).

If there is no functional terminal 10 with a faulty connection (case of no mounting abnormality), the external device 3 displays on the monitor screen an image informing that connection state between the device 1 and the substrate 2 is proper (passes the test) (Step S8). The inspection operator who has confirmed the monitor screen stops supply of power to the device 1, removes the communication line 19 from the port 20 (Step S9), and sends the substrate 2 mounted on the device 1 to the next process.

Meanwhile, if there is a functional terminal 10 with a faulty connection (case of mounting abnormality), the external device 3 displays on the monitor screen an image informing that connection state between the device 1 and the substrate 2 is improper (fails the test) (Step S10) This image includes information specifying the functional terminal 10 judged having a faulty connection. The inspection operator who has confirmed the monitor screen stops supply of power to the device 1, removes the communication line 19 from the port 20 (Step S11), and analyzes the faulty connection.

As described above, according to this embodiment, conduction state of the inspection terminal 13 is detected so as to judge the connection state of the functional terminal 10 from the detection result. As a result, even if the solder joints 9 have unstable electric contact but externally finding cracking or rupture is difficult, detection of the poor connection is possible.

Moreover, in the device 1, the CPU 14 receives the inspection start command from the external terminal 3 and inspects its on connection state with the substrate 2, and the external terminal 3 conducts processing in the inspection process in conformity with the prestored inspection program. Accordingly, a special inspection apparatus is unnecessary, and judgment of mounting abnormality on the device 1 is possible by just setting the inspection program in the general-purpose external terminal 3 and connecting the external terminal 3 and the device 1 via a connecting line. Therefore, even when a failure occurs after the substrate 2 is integrated into a product and shipped, and inspection and repair of the mounted state of the device 1 on the substrate 2 is necessary, a person in charge of repair may easily inspect the mounting state any place without sending that product (device 1 and substrate 2) to the factory etc. at which the inspection process is carried out.

Moreover, with the device 1, since the internal CPU 14 inspects its oven connection state with the substrate 2, prompt inspection is possible.

In addition, setting a small number of the inspection terminals 13 allows reduction in inspection time.

Furthermore, since peripheral redundant terminals 11 are used as the inspection terminals 13 without needing to directly inspect the functional terminal 10 of the device 1 mounted on the substrate 2, stable inspection results may be obtained without any adverse influence of the characteristics (e.g., fluctuation in input impedance and the like) of the external device 12 to be connected via the functional terminal 10.

A second embodiment of the present invention is described next. The second embodiment is basically the same as the first embodiment except for the criteria for selecting inspection terminals 13 from the multiple redundant terminals 11. Therefore, the same symbols are used in the common structure to the first embodiment, and description thereof is omitted.

Figure 10:
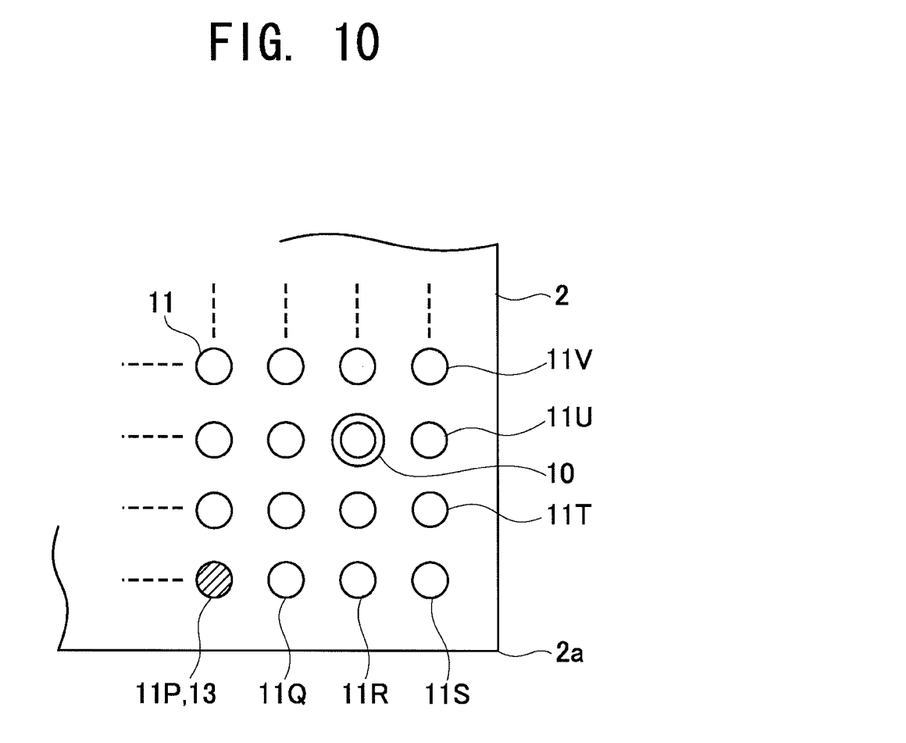
FIG. 10 is a schematic diagram explaining selection criteria for an inspection terminal in another embodiment.

In other words, while the redundant terminals 11 within a judgment distance from the functional terminal 10 are objects to be selected as the inspection terminal 13 in the first embodiment, in this embodiment, of the multiple redundant terminals 11, redundant terminals 11P, 11Q, 11R, 11S, 11T, 11U, 11V . . . in the outermost periphery of the array pattern of the terminals 7 are objects to be selected as the inspection terminal 13 (FIG. 10 shows an example of selecting the redundant terminal 11P as the inspection terminal 13), as shown in FIG. 10.

While use of any one of the redundant terminals 11P . . . arranged in the outermost periphery of the array pattern as the inspection terminal 13 is arbitrary, it is preferable to set at least one of the inspection terminals 13 at each side (e.g., four sides in a quadrille pattern) in the outermost periphery of the array pattern, and select the redundant terminal 11S (e.g., redundant terminal arranged in a corner of the array pattern), which is arranged closest to the corner 2a of the substrate 2, as the inspection terminal 13. As such, the inspection terminal 13 is selected from the redundant terminals 11 arranged in the outermost periphery of the array pattern of the terminals 7 because in light of deformation (curvature) of the substrate 2 adversely influencing the connection states of the terminals 7, the peripheral edge side (outermost periphery of the array pattern) of the substrate 2 is influenced more than the central portion thereof (inner side of the array pattern). Note that in this case, with the external terminal 3, the connection state of the entire substrate 2 is judged, but each individual connection state of the functional terminals 10 is not judged. Moreover, of the multiple redundant terminals 11P . . . arranged in the outermost periphery, the redundant terminal 11 closest to the functional terminal 10 (the redundant terminal 11U in the case of FIG. 10) may be given priority and selected as the inspection terminal 13.

Note that the descriptions of the respective embodiments given above are merely examples of the present invention. Therefore, the present invention is not limited to the respective embodiments given above, and it is needless to say that other various changes may be made without departing from the technical spirit or scope of the present invention.

For example, a terminal that can be switched over to be an input terminal with a pull-down resistor may be used as the inspection terminal. In this case, since the output side of the inspection terminal is connected to be in the power supply level, it may be judged as in a proper connection when the input voltage in inspection mode is in the power supply level while it may be judged as a faulty connection when the input voltage is in the GND level.

Moreover, a redundant terminal not having the function of switching over to be an input terminal with a pull-up resistor or function of switching over to be an input terminal with a pull-down resistor may be used for the inspection terminal. In this case, a circuit, which switches over between with and without application of a predetermined voltage to the inspection terminal in normal mode and inspection mode, and when in normal mode, sets the input voltage of the inspection terminal to either a predetermined level or the GND level, and when in the inspection mode, sets the input voltage of the inspection terminal to either a predetermined level or the GND level, expecting the terminal connection is proper, and sets the input voltage of the inspection terminal to the opposite level to the earlier set level, expecting a faulty connection, should be provided.

Alternatively, the first embodiment and the second embodiment may be combined, using the redundant terminals 11 within the judgment distance from the function terminals 10 as the inspection terminals 13, and using the redundant terminals 11 arranged in the outermost periphery in the array pattern of the terminals 7 as the inspection terminals 13.

Further alternatively, the pattern of inspection terminals may be, made changeable in accordance with a command from the external terminal 3 by prestoring in the ROM 15 of the device 1 multiple voltage detection programs for different patterns. (number and/or arrangement) of inspection terminals.

While preferred embodiments of the present invention have been described. using specific terms, such description is for illustrative purposes, and it is to be understood that changes and variations may be made without departing from the spirit or scope of the following claims.

The content of Application No. TOKUGAN 2009-246200 which was filed in Japan on Oct. 27, 2009 and on which the claim to priority for this application is based, is hereby incorporated by reference.

What is claimed is:

1. An electronic component comprising a plurality of terminals to be connected to a mounting surface of a substrate through soldering; said electronic component comprising:
   a transmitting and receiving unit for transmitting and receiving information to and from an external terminal; and
   a detection controller for starting inspection processing in a state where the plurality of terminals is connected to the mounting surface, in response to the transmitting and receiving unit having received an inspection start information from the external terminal and causing the transmitter and the receiver to transmit an inspection result to the external terminal; wherein
   the plurality of terminals comprises a functional terminal to be connected to another device, and a redundant terminal not connected to the other device, and
   the redundant terminal comprises an inspection terminal that is switchable to be an input terminal either with a pull-up resistor or a pull-down resistor; and
   the detection controller, in the inspection processing, switches the inspection terminal over to be an input terminal either with a pull-up resistor or a pull-down resistor so that a predetermined voltage is applied to the inspection terminal, detects the input voltage of the inspection terminal, and transmits detected input voltage as an inspection result to the external terminal.

2. The electronic component of claim 1, wherein the detection controller causes the function terminal to transmit to the external terminal the input voltage of an inspection terminal within a predetermined range as an inspection result of the function terminal.

3. The electronic component of claim 2, wherein number of the inspection terminal is set to a greater number the narrower the predetermined range, and set to a lesser number the wider the predetermined range.

4. The electronic component of claim 1, wherein the redundant terminal arranged in the outermost periphery in an array pattern of the plurality of terminals includes the inspection terminal.

5. An inspection system, comprising:
   an electronic component comprising a plurality of terminals;
   a substrate comprising a mounting surface on which the plurality of terminals is soldered; and
   an external terminal, which judges whether or not connection states between the plurality of terminals and the mounting surface are proper, wherein
   the electronic component further comprises a transmitting and receiving unit and a detection controller,
   the transmitting and receiving unit transmits and receives information to and from the external terminal,
   the plurality of terminals includes a functional terminal to be connected to another device, and a redundant terminal not connected to the other device,
   the redundant terminal includes an inspection terminal that is switchable to be an input terminal either with a pull-up resister or a pull-down resistor,
   the detection controller starts inspection processing because the transmitting and receiving unit has received inspection start information, switches the inspection terminal over to be an input terminal either with a pull-up resistor or a pull-down resistor so that a predetermined voltage is applied to the inspection terminal, detects the input voltage of the inspection terminal, and transmits the detected input voltage as an inspection result to the external terminal, and
   the external terminal judges Whether or not connection states between the plurality of terminals and the substrate are proper based on an inspection result received from the electronic component.

6. The inspection system of claim 5, wherein the detection controller causes the function terminal to transmit to the external terminal the input voltage of an inspection terminal within a predetermined range from the function terminal as an inspection result of the function terminal.

7. The inspection system of claim 5, wherein the external terminal compares a detected data pattern corresponding to the inspection results received from the electronic component to a prestored expected value pattern, and when both patterns match, judges that connection states between the plurality of terminals and the substrate are proper.

8. An electronic component comprising a plurality of terminals to be connected to a mounting surface of a substrate through soldering; said electronic component comprising:
   a transmitter/receiver, which transmits and receives information to and from an external terminal; and
   a detection control unit, which starts inspection processing in a state where the plurality of terminals is connected to the mounting surface, in response to the transmitting and receiving unit having received an inspection start information from the external terminal and causing the transmitter and the receiver to transmit an inspection result to the external terminal; wherein
   the plurality of terminals comprises a functional terminal to be connected to another device, and a redundant terminal not connected to the other device;
   the redundant terminal comprises an inspection terminal that is switchable to be an input terminal either with a pull-up resistor or a pull-down resistor; and
   the detection control unit, in the inspection processing, switches the inspection terminal over to be an input terminal either with a pull-up resistor or a pull-down resistor so that a predetermined voltage is applied to the inspection terminal, detects the input voltage of the inspection terminal, and transmits detected input voltage as an inspection result to the external terminal.

* * * * *